United States Patent
Obradovic et al.

(10) Patent No.: US 9,773,904 B2
(45) Date of Patent: Sep. 26, 2017

(54) VERTICAL FIELD EFFECT TRANSISTOR WITH BIAXIAL STRESSOR LAYER

(71) Applicant: Samsung Electronics Co., Ltd., Suwon-si, Gyeonggi-do (KR)

(72) Inventors: Borna Obradovic, Leander, TX (US); Chris Bowen, Austin, TX (US); Titash Rakshit, Austin, TX (US); Palle Dharmendar, Austin, TX (US); Mark Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/132,960

(22) Filed: Apr. 19, 2016

(65) Prior Publication Data
US 2017/0077304 A1 Mar. 16, 2017

Related U.S. Application Data (60) Provisional application No. 62/217,563, filed on Sep. 11, 2015.

(51) Int. Cl.
*H01L 29/78* (2006.01)
*H01L 29/786* (2006.01)
(Continued)

(52) U.S. Cl.
CPC .. *H01L 29/7842* (2013.01); *H01L 21/823487* (2013.01); *H01L 29/42392* (2013.01); *H01L 29/66522* (2013.01); *H01L 29/66666* (2013.01); *H01L 29/66742* (2013.01); *H01L 29/78642* (2013.01); *H01L 29/78681* (2013.01); *H01L 29/78696* (2013.01)

(58) Field of Classification Search
CPC ............ H01L 29/7849; H01L 29/7842; H01L 29/66666; H01L 21/76879; H01L 29/78696; H01L 29/78642; H01L 29/7827
See application file for complete search history.

(56) References Cited

U.S. PATENT DOCUMENTS 4,827,320 A 5/1989 Morkoc et al.
6,465,815 B2 10/2002 Liu et al.
(Continued)

OTHER PUBLICATIONS

Huang et al., "Surface Passivation of III-V Compound Semiconductors Using Atomic-Layer-Deposition-Grown $Al_2O_3$", *Appl. Phys. Lett.*, 87, pp. 252104-1-252104-3, 2005.
(Continued)

*Primary Examiner* — Daniel Luke
(74) *Attorney, Agent, or Firm* — Myers Bigel, P.A.

(57) ABSTRACT

A vertical field effect device includes a substrate and a vertical channel including $In_xGa_{1-x}As$ on the substrate. The vertical channel includes a pillar that extends from the substrate and includes opposing vertical surfaces. The device further includes a stressor layer on the opposing vertical surfaces of the vertical channel. The stressor layer includes a layer of epitaxial crystalline material that is epitaxially formed on the vertical channel and that has lattice constant in a vertical plane corresponding to one of the opposing vertical surfaces of the vertical channel that is greater than a corresponding lattice constant of the vertical channel.

30 Claims, 6 Drawing Sheets

(51) Int. Cl.
    *H01L 29/423*     (2006.01)
    *H01L 29/66*     (2006.01)
    *H01L 21/8234*     (2006.01)

(56) References Cited

U.S. PATENT DOCUMENTS

| | | |
|---|---|---|
| 7,018,901 B1 | 3/2006 | Thean et al. |
| 8,884,265 B2 | 11/2014 | Bennett et al. |
| 8,906,768 B2 | 12/2014 | Wong et al. |
| 2014/0001519 A1 | 1/2014 | Dewey et al. |
| 2015/0048292 A1* | 2/2015 | Park .................... H01L 27/2454 257/2 |
| 2015/0072490 A1 | 3/2015 | Doyle et al. |
| 2015/0091058 A1 | 4/2015 | Doyle et al. |
| 2015/0137073 A1 | 5/2015 | Gotsmann et al. |
| 2015/0380555 A1* | 12/2015 | Ohtou ................ H01L 29/7849 257/329 |

OTHER PUBLICATIONS

Zhou et al., "III-V Gate-Wrap-Around Field-Effect-Transistors with High-k Gate Dielectrics", Device Research Conference (DRC), pp. 207-208, DOI:10.1109/DRC.2014.6872370, Jun. 25, 2014.

\* cited by examiner

VERTICAL FIELD EFFECT TRANSISTOR WITH BIAXIAL STRESSOR LAYER

RELATED APPLICATIONS

The present application claims the benefit of and priority to U.S. Provisional Patent Application No. 62/217,563, filed Sep. 11, 2015, entitled "A High-Performance Vertical III-V FET Device Suitable for High-VDD Operation," the disclosure of which is hereby incorporated herein by reference in its entirety.

BACKGROUND

1. Field

The present disclosure relates to field effect transistors and methods of manufacturing the same. In particular, the present disclosure relates to vertical field effect transistor (vFET) devices and methods of manufacturing vFET devices.

2. Description of the Related Art

In order to provide semiconductor devices with greater operational speed and an increased level of integration, the channel length of MOS field effect transistors (MOSFETs) has been gradually reduced. However, in a planar MOSFET device structure, reducing the channel length may result in a short channel effect that may reduce the current drive capacity of the device. To control the threshold voltage of a planar MOSFET, it may be desirable to increase the impurity concentration in the channel. However, this may reduce the mobility of carriers in the channel, which may reduce the ON state current of the device. Therefore, in the planar MOSFET device structure, it may be difficult to suppress the short channel effect while obtaining a more rapid operational speed and an increased integration level.

A vertical field effect transistor (or vFET) device has a structure that may be capable of reducing the short channel effect. The vFET device includes an active region having a three-dimensional fin shape that includes source and drain regions above and below a channel region. The channel region is surrounded by a gate electrode. Thus, a three-dimensional channel may be formed along vertical surfaces, or sidewalls, of the fin. Because the channel is formed on sidewalls of the fin, the vFET device may have a larger effective channel width in a relatively small horizontal area compared to a conventional planar MOSFET. Thus, a vFET semiconductor device may have a relatively small size and a more rapid operational speed than a similarly sized conventional planar MOSFET device.

For n-channel devices, vFETs utilizing III-V channels based on InGaAs may offer significantly higher carrier mobilities and injection velocities than their Si counterparts. However, while the transport properties of the InGaAs channel are desirable, InGaAs devices have a more limited maximum VDD than Si devices. There are two sources of this VDD limitation. For In-rich channel layers, the bandgap is narrow, resulting in large Band-To-Band-Tunneling (BTBT) leakage. BTBT leakage is strongly voltage dependent, which limits the upper bound of VDD to about 0.75 V for devices generally at the 7 nm technology node and beyond.

In contrast, Ga-rich channels have large bandgaps with less associated BTBT problems. However, in devices with Ga-rich channels, the Gamma and L valleys in the conduction band are close in energy, e.g., with an energy separation less than about 0.4 eV. The conduction band energy diagram of many semiconductor materials has a valley, referred to as the Gamma valley (or Γ-valley) near a momentum of k=0. At higher or lower levels of momentum, however, there is another valley in the conduction band energy diagram, referred to as the L-valley. The difference in energy between the bottom of the Gamma-valley and the bottom of the L-valley is referred to as the L-Γ gap. Carriers in the L-valley may have low mobility compared to carriers in the Gamma-valley. It is therefore desirable for device operation that most or all carriers in a device channel be confined in the lower energy Gamma-valley.

Spillover of carriers from the Gamma-valley to the L-valley may occur in response to an applied gate voltage, with the fraction of carriers in the Gamma-valley dropping sharply with applied gate voltage. As an example, to retain a fraction of carriers in the Gamma-valley greater than 0.9, for a case of an unstrained GaAs channel layer of 5 nm thickness, a maximum gate voltage is ~0.55V, assuming a threshold voltage of ~0.4V.

The close proximity of the Gamma- and L-valley energy levels is particularly true for thin channel devices, in which quantum mechanical effects decrease the relative separation of the Gamma- and L-valleys. The small separation can result in a significant fraction of the electron population being in the low-mobility L-valley at equilibrium. Thus, as channel thicknesses get smaller, more spillover occurs.

Due to the low mobility of carriers in the L-valley, occupation of the L-valley results in performance degradation. While the effect is not necessarily as catastrophic as an increase in leakage current (as can happen from BTBT), it nevertheless makes VDD increases useless from a performance enhancement standpoint. That is, as VDD increases, the device may exhibit limited or no performance improvement, even while power consumption increases.

While it is possible to tailor the indium content of an InGaAs channel to optimize device performance at a desired VDD level, compositional optimization alone may not be sufficient to provide high-VDD operating ranges with high performance and/or low leakage.

SUMMARY

A vertical field effect device according to some embodiments includes a substrate and a vertical channel including $In_xGa_{1-x}As$ on the substrate. The vertical channel includes a pillar that extends from the substrate and includes opposing vertical surfaces. The device further includes a stressor layer on the opposing vertical surfaces of the vertical channel. The stressor layer includes a layer of epitaxial crystalline material that is epitaxially formed on the vertical channel and that has lattice constant in a vertical plane corresponding to one of the opposing vertical surfaces of the vertical channel that is greater than a corresponding lattice constant of the vertical channel. The device further includes a dielectric layer on the stressor layer, and a gate electrode on the dielectric layer.

The stressor layer may impart a biaxial tensile strain to the vertical channel in the vertical plane corresponding to the opposing vertical surfaces of the vertical channel.

The stressor layer may include a III-V compound semiconductor material, and in particular may include InP, AlSb, or GaSb. In some embodiments, the stressor layer may include a II-VI compound semiconductor material, such as CdSe or ZnTe. The vertical channel layer may have a bandgap greater than 1 eV.

The stressor layer may completely envelop the vertical channel, and in some embodiments may impart a biaxial strain of about 0.5 to about 1.5 GPa to the vertical channel.

The vertical channel may include a second pair of opposing vertical surfaces that extend in parallel to a second vertical plane that is perpendicular to the first vertical plan. The stressor layer may be formed on the second pair of opposing vertical surfaces and may have a second lattice constant in the second vertical plane that is greater than a second lattice constant of the vertical channel in the second vertical plane.

In various embodiments, the value of x may be in the range $0.1<x<0.3$, and in some embodiments in the range $0.15<x<0.25$.

The lattice constant of the stressor layer may be about 1% to about 3% larger than the lattice constant of the vertical channel. The stressor layer may have a thickness of about 0.5 to 2 times a thickness of the vertical channel layer, and may have a conduction band offset of at least about 200 meV relative to the vertical channel layer. A Gamma-L energy separation in the vertical channel layer may be greater than about 350 meV.

The vertical channel layer may have a gate length of between 20 nm and 40 nm and a channel width greater than 10 nm. The vertical channel layer may have a thickness of between 3 nm and 10 nm.

The vertical channel may have a second vertical surface that is non-parallel to the opposing vertical surfaces, and the stressor layer may impart biaxial strain to both the opposing vertical surfaces of the vertical channel and the second vertical surface of the vertical channel. The second vertical surface may be perpendicular to the opposing vertical surfaces and may extend between the opposing vertical surfaces.

Some embodiments of the inventive concepts provide methods of forming a vertical field effect device. The methods include forming a preliminary device structure on a substrate, the preliminary device structure including a sacrificial gate, etching a trench through the preliminary device structure, the trench extends through the sacrificial gate, forming a vertical channel layer including epitaxial $In_xGa_{1-x}As$ in the trench, $0.1<x<0.3$, removing the sacrificial gate to expose a vertical sidewall of the vertical channel layer, forming a stressor layer on the exposed vertical sidewall of the vertical channel layer, the stressor layer may include an epitaxially grown crystal having a lattice constant greater than a corresponding lattice constant of the vertical channel layer in a plane corresponding to the vertical sidewall of the vertical channel layer, the stressor layer imparts a biaxial tensile strain to the vertical channel layer, forming a gate insulator on the stressor layer, and forming a gate on the gate insulator.

BRIEF DESCRIPTION OF THE DRAWINGS

The accompanying drawings are included to provide a further understanding of the disclosure and are incorporated in and constitute a part of this application. In the drawings.

DETAILED DESCRIPTION OF EMBODIMENTS

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

Embodiments of the present inventive concepts provide methods for the formation of semiconductor devices and the resulting structures. These embodiments are discussed below in the context of forming FET transistors having a single or multiple fins or pillars on a heteroepitaxial substrate.

Some embodiments of the inventive concepts provide a vFET with a biaxially strained InGaAs channel. The biaxial strain is imparted by means of a crystalline stressor layer on the channel. The channel may have a low indium content that can increase the bandgap of the channel layer, which can reduce band-to-band tunneling.

The biaxial strain imparted by the stressor layer is tensile in nature, and has the effect of increasing the Gamma-L valley separation in the channel layer. By increasing the Gamma-L separation, electron spillover from the L-valley to the Γ-valley may be suppressed, which may enable increased VDD operation.

A moderate In concentration in the InGaAs channel layer (~20%, i.e. Ga-rich), coupled with a 1 GPa biaxial tensile strain may result in a device which can be operated at a VDD over 1V with no substantial electron spillover or band-to-band tunneling (BTBT). Furthermore, mobility and injection velocity may be slightly better (due to strain) than in conventional unstrained InGaAs devices with high In content (e.g. >40%).

The VDD voltage range of operation of a device according to some embodiments can be near or above 1V, which is much higher than for typical InGaAs devices, which have a maximum VDD of about 0.75V or less. The VDD voltage range in a device according to some embodiments may be large because electron spillover may be suppressed. Reducing the indium content of the channel layer increases its bandgap, which helps to suppress band-to-band tunneling.

Moreover, channel mobility may be greatly enhanced by the crystalline nature of the stressor layer. Channel mobility may be enhanced somewhat further by the biaxial strain in the channel. This would not be practical in a horizontal device.

Accordingly, some embodiments may address two simultaneous problems in the design of FET devices which limit the upper bound of VDD for $In_xGa_{1-x}As$ FETs. Devices in which the indium atomic percentage "x" is less than 0.15 have a wide bandgap, e.g. >1.2 eV. Due to this large bandgap, Band-To-Band Tunneling (BTBT) leakage is not a concern, even at voltages greater than 1V. However, Ga-rich devices also have a small energy separation between the Gamma and L valleys in the conduction band. The separation gets particularly small in thin channels (<200 meV), due to Quantum-Mechanical effects of confinement. Since the equilibrium Fermi level is approximately 200 meV above the Gamma valley minimum under typical inversion conditions, the L-valley becomes nearly degenerately occupied (termed "spillover"). The high occupation fraction of the L-valley results in performance loss of the device, due to the comparatively low mobility and velocity of carriers in the L-valley. From a performance standpoint, it is desirable to keep all carriers in the Gamma (Γ) valley. While spillover does not lead to immediate failure of the device, or even excessive leakage or heating, it largely eliminates the utility of increased VDD for improved performance (since there is very little improvement and possibly degradation, depending on the magnitude of the VDD increase).

Unlike Ga-rich devices, In-rich devices (i.e. devices in which the indium atomic percentage "x" is greater than 0.5) have a large separation between the Gamma- and L-valleys, and may not typically suffer from spillover under I-D confinement (i.e. in FinFET, Nanosheet, and vFET structures, but not Nanowires). However, the bandgap of In-rich materials is small, typically less than <0.75 eV, and therefore devices with In-rich channels may tend to be prone to large BTBT leakage currents. It is therefore desirable to keep VDD for In-rich devices low, in order to reduce BTBT. Thus, neither In-rich nor Ga-rich devices can operate at high VDDs, each due to different limiting factors.

FET devices according to some embodiments may overcome the spillover constraint on Ga-rich devices and the band-to-band tunneling effect in In-rich devices, thus enabling them to operate at high VDD. This is accomplished by introducing a high level of biaxial strain in the channel. Based on simulation, tensile biaxial strain increases the Gamma-L separation for Ga-rich channels. With 1 GPa of tensile biaxial strain, the Gamma-L separation of $In_{0.25}Ga_{0.75}As$ is approximately 0.5 eV for a 5 nm thick channel. This separation may be sufficient to suppress spillover at a VDD of 1V. In contrast, simulation further indicates that uniaxial strain is not as effective as biaxial strain in increasing the Gamma-L separation.

Figure 1A:
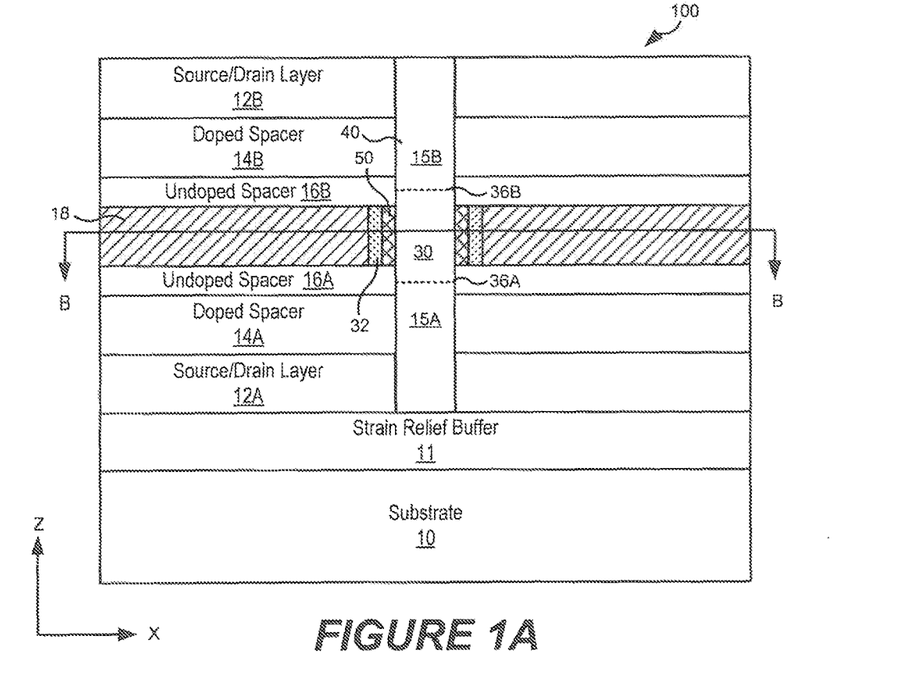
FIG. 1A is a cross-section of a vFET device in accordance with some embodiments.
Figure 1B:
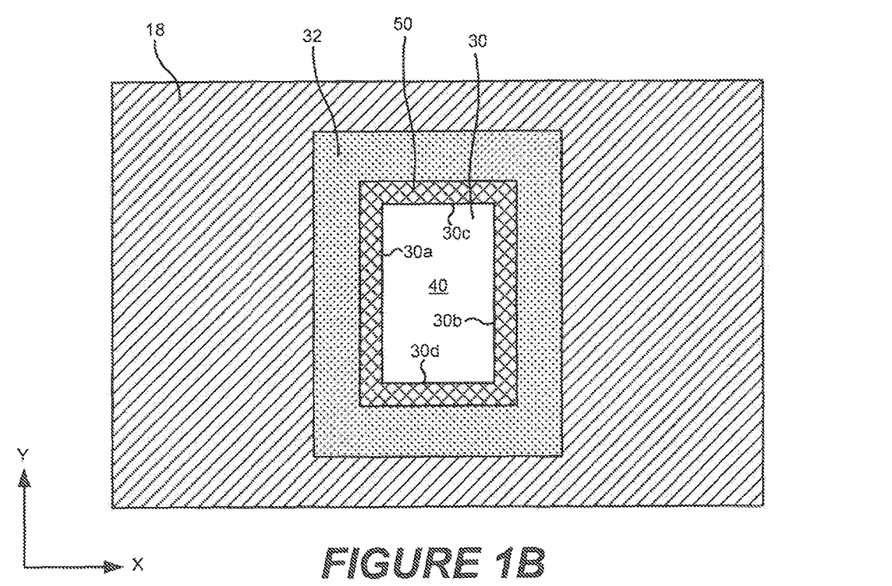
FIG. 1B is a horizontal cross section taken along line B-B of FIG. 1A.

FIG. 1A is a cross-section of a vFET device in accordance with some embodiments, and FIG. 1B is a horizontal cross section taken along line B-B of FIG. 1A. As shown therein, a vFET device 100 is formed on an epitaxial growth substrate 10 that may include a III-V semiconductor material, such as InP. Further support layers (not shown), such as silicon, silicon-on-oxide (SOI), or other materials, may be provided beneath the epitaxial growth substrate 10 to provide mechanical support to the structure. In some embodiments, the epitaxial growth substrate 10 may be removed after growth of the remaining layers, and therefore may be omitted from the final device structure. A strain relief buffer 11, such as a GaAs layer, may be formed on the substrate 10 to facilitate the formation of subsequent III-As based device layers.

A pillar 40 comprising a GaAs-based semiconductor material is formed on the substrate 10. Adjacent to and surrounding the pillar 40 is a stacked structure including a first source/drain layer 12A, a first doped oxide spacer 14A, a first undoped oxide spacer 16A, a gate electrode 18, a second undoped oxide spacer 16B, a second doped oxide spacer 14B, and a second source/drain layer 12B. Upper and lower portions of the pillar 40 are doped with a first conductivity type dopant to provide a first source/drain region 15A in a lower portion of the pillar 40 and a second source/drain region 15B in an upper portion of the pillar 40. A central portion of the pillar adjacent the gate electrode 18 can be doped with a second conductivity type dopant to form a channel region 30 of the device. The first and second conductivity type dopants have opposite conductivity types, so that PN junctions 36A, 36B are defined in the pillar 40.

The channel region 30 may be formed of $In_xGa_{1-x}As$, while the source/drain regions 15A, 15B and source/drain layers 12A, 12B may include $In_yGa_{1-y}As$, where x<>y. That is, all of the channel region 30 and the source/drain regions 15A, 15B and source/drain layers 12A, 12B may comprise InGaAs-based materials. However, the channel region 30 and the source/drain regions 15A, 15B and source/drain layers 12A, 12B may have different material compositions. In some embodiments, the value of "x" which represents the atomic percentage of In in the channel region 30 may be in the range of 0.1<x<0.3. In some embodiments, "x" may be in the range of 0.15<x<0.25. Accordingly, a channel region 30 in a device according to some embodiments may have a relatively low indium concentration, which may increase the bandgap of the channel region 30 and reduce band-to-band tunneling. In particular, the vertical channel region 30 may have a bandgap greater than about 1 eV in some embodiments.

The first and second doped oxide spacers 14A, 14B may be doped with a first conductivity type dopant. As will be discussed in more detail below, the first and second doped oxide spacers 14A, 14B may serve as doping sources for the source/drain regions 15A, 15B. In some embodiments, the first and second source/drain regions 15A, 15B may have graded doping profiles in which the concentration of dopant atoms changes with distance from the substrate 10.

Referring to FIGS. 1A and 1B, a stressor layer 50 is provided on the pillar 40 adjacent the channel region 30. The stressor layer 50 is a crystalline layer that is epitaxially formed on the sidewalls of the pillar 40 adjacent the channel region 30 and surrounds the pillar 40 adjacent the channel region 30. The stressor layer 50 imparts a biaxial tensile strain to the channel region 30, as will be discussed in more detail below. In this context, "biaxial" means that strain is imparted to the channel region along at least two axes, such as in the y- and z-directions shown in FIGS. 1A and 1B. It will be appreciated that stress may also be applied in the x-direction; however, such stress may be smaller than the stress applied in the y- and z-directions. It will be appreciated that stress may also be applied in the x-direction; however, such stress may be smaller than the stress applied in the y- and z-directions.

In the vFET device 100 according to some embodiments, the stressor layer 50 is epitaxially grown on the channel region 30. The stressor layer 50 is chosen to have a lattice constant larger than a corresponding lattice constant of the channel layer, thereby resulting in tensile strain in the channel region 30. The resulting strain is mostly biaxial, in contrast to the case of a conventional FinFET (in which biaxial strain from the substrate is converted into uniaxial strain in the fin, due to strain relaxation on the free fin surfaces).

In some embodiments, the material of the stressor layer 50 may also have a large (e.g., at least 200 meV) conduction-band offset to the material of the channel layer. This may ensure that electrons are confined to the channel region 30, and cannot spread into the stressor layer 50. Additionally, the stiffness of the stressor layer 50 may be comparable to or larger than that of the channel region 30 in order to successfully impart strain to the channel region 30 without the stressor layer 50 having to be excessively thick. A pliable or amorphous stressor layer 50 may not transfer significant strain to the channel region 30, unless the stressor layer 50 was very thick, which may degrade device electrostatics.

It may also be desirable for the interface between the channel region 30 and the stressor layer 50 to be as defect-free as possible. A highly defective interface may degrade device electrostatics and/or mobility. The defective interface, as characterized by the trap interface density Dit (density in area and energy), increases the channel capacitance in the subthreshold regime. The increased channel capacitance results in less favorable capacitive voltage division of the applied gate voltage across the gate dielectric/channel stack (ideally, any gate voltage increment is dropped entirely across the channel, but only fractionally so in reality due to the aforementioned voltage division). Due to this degraded voltage division, the channel surface potential follows the applied gate voltage imperfectly. This is referred to as "degraded gate control", and is evidenced by an increase in the sub-threshold slope (SS). A consequence of increased SS is a larger required value for the threshold voltage (Vt) at matched off-state current, resulting in reduced on-state performance. In the above threshold regime, the interface states act as ionized impurity scattering centers, degrading the mobility of carriers in the channel. Various process strategies for passivation of the interface are employed in order to reduce/minimize Dit.

The material of the stressor layer 50 may be selected from a number of different choices. In the group III-V semiconductors, AlSb is a suitable material, having a lattice constant larger than that of the channel, and a mechanical stiffness comparable to the channel. In the group II-VI semiconductors, ZnTe, CdS, and CdSe are all suitable materials. Other materials may be used as the stressor layer 50 provided they meet the requirements described above.

In some embodiments, the stressor layer 50 may impart a biaxial strain of about 0.5 to about 1.5 GPa to the vertical channel region 30. Due to this biaxial strain, the mobility of the channel region 30 may be increased.

As illustrated in FIG. 1B, the stressor layer 50 may completely envelop the vertical channel region 30 in a horizontal (x-y) plane.

In some embodiments, the lattice constant of the stressor layer 50 may be about 1% to about 3% larger than a corresponding lattice constant of the vertical channel region 30. For example, an in-plane lattice constant of the stressor layer 50 in the x-y plane, the x-z plane and/or the y-z plane as illustrated in FIGS. 1A-1B may be about 1% to about 3% larger than a corresponding lattice constant of the vertical channel region 30.

In some embodiments, the stressor layer 50 may have a thickness of about 0.5 to 2 times a thickness of the vertical channel region 30 (i.e., the thickness of the pillar 40 where the vertical channel region 30 is formed). The vertical channel region 30 may have a thickness of between 3 nm and 10 nm, while the stressor layer 50 may have a thickness of between 1.5 nm to 20 nm.

In some embodiments, the stressor layer 50 may have a conduction band offset of at least about 200 meV relative to the vertical channel region 30, so that carriers in the channel region 30 do not spill into the stressor layer 50.

In some embodiments, a Gamma-L energy separation in the vertical channel region 30 may be greater than about 350 meV.

The vertical channel region 30 may have a gate length of between 20 nm and 40 nm, which may help to avoid a short channel effect. The vertical channel layer may have a channel width greater than 10 nm.

Referring to FIG. 1B, the vertical channel may include first and second parallel vertical surfaces 30a, 30b and third and fourth vertical surfaces 30c, 30d that are oblique to the first and second vertical surfaces 30a, 30b. The stressor layer 50 may impart biaxial strain to both the parallel vertical surfaces 30a, 30b of the vertical channel as well as to the third and fourth vertical surfaces 30c, 30d of the vertical channel region.

The effect of uniaxial strain on III-As based channel layers having various thicknesses is now discussed, based on simulation. If a tensile uniaxial strain (SXX) in the (100) plane is applied, the Gamma-L valley separation (referred to as "LGgap") generally increases and the bandgap decreases but the effect of uniaxial strain is small, i.e. a large uniaxial strain must be applied to achieve a meaningful effect.

Spillover from the Gamma-valley to the L-valley is affected as a result of uniaxial strain on GaAs layers of various thicknesses, according to simulation results. Spillover as a function of gate voltage (Vg–Vt) is somewhat reduced when 2 GPa of uniaxial tensile strain is applied to the layers compared to no strain; however, spillover may remain a problem, especially for thinner channel layers (i.e., less than 10 nm).

The effect of biaxial strain on GaAs channel layers having various thicknesses is now discussed, based on simulation. If a tensile biaxial strain (SXX) is applied, the spillover is significantly less compared to uniaxial strained GaAs. Moreover, the bandgap of the GaAs layer remains greater than 1 eV even with tensile strain approaching 2 GPa over a range of channel thicknesses.

The effect of biaxial strain on $In_{0.25}Ga_{0.75}As$ layers is now discussed. For $In_{0.25}Ga_{0.75}As$, the LGgap increases remarkably with increasing tensile biaxial strain (SXX). Moreover, the bandgap of $In_{0.25}Ga_{0.75}As$ remains acceptably high at moderate levels of biaxial tensile strain over a range of channel thicknesses.

Furthermore, simulation shows a remarkable decrease in spillover in $In_{0.25}Ga_{0.75}As$ layers strained with 1 GPa of biaxial tensile strain compared to unstrained GaAs layers.

Figure 2:
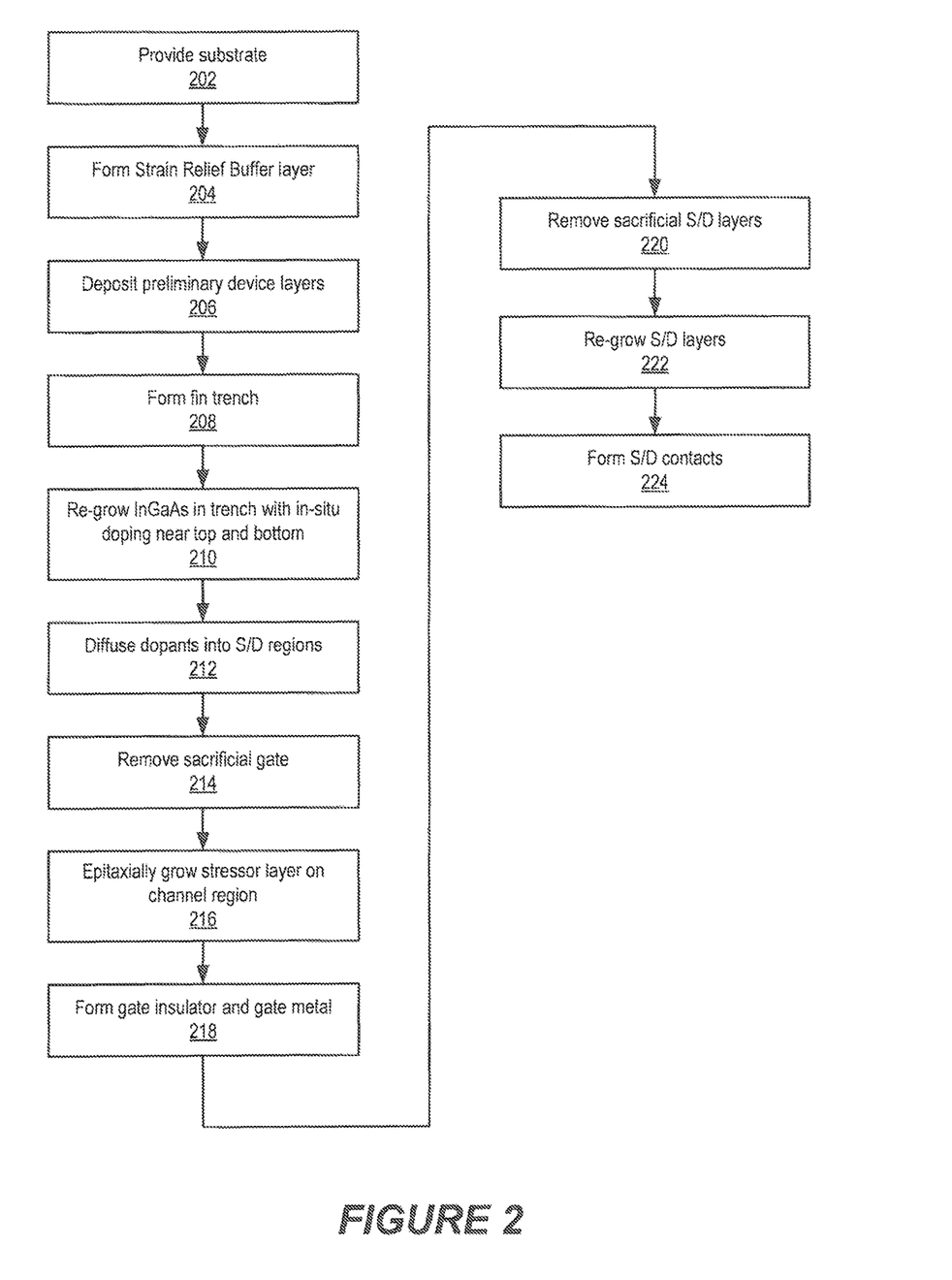
FIG. 2 is a flowchart illustrating operations of forming a vFET device in accordance with some embodiments.
Figure 3A:
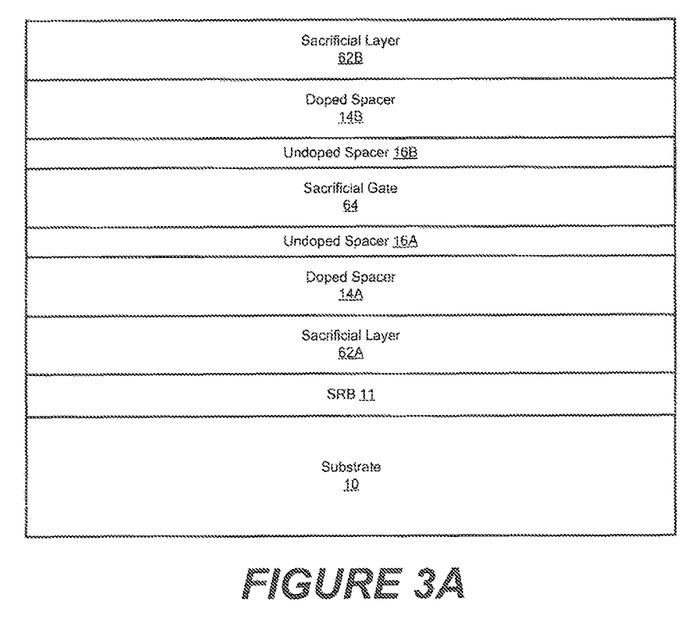
FIGS. 3A to 3H are cross-sectional diagrams illustrating the formation of a vFET device in accordance with some embodiments.

Operations associated with fabricating a vFET device according to some embodiments are illustrated in FIG. 2 and FIGS. 3A to 3H. Referring to FIGS. 2 and 3A, the operations begin by providing a substrate 10 (block 202). The substrate may be any material that is suitable for growing III-As material thereon, such as InP.

At block 204, a strain relief buffer 11 is formed on the substrate 10 via an epitaxial growth technique, such as chemical vapor deposition (CVD) or molecular beam epitaxy (MBE). The strain relief buffer 11 may comprise GaAs, InGaAs, or another suitable material.

Still referring to FIGS. 2 and 3A, at block 206, a stack of preliminary device layers is formed on the strain relief buffer 11. The stack includes a first sacrificial layer 62A, a doped spacer layer 14A, an undoped spacer layer 16A, a sacrificial gate layer 64, a second undoped spacer layer 16B, a second doped spacer layer 14B and a second sacrificial layer 62B. The spacer layers 14A, 14B, 16A and 16B may include oxide. The doped spacer layers 14A, 14B may be doped with n-type dopants at a concentration of about $10^{19}$ cm$^{-3}$, and may have a thickness of about 4-10 nm. The undoped spacer layers 16A, 16B may have a thickness of about 0-10 nm.

The first and second sacrificial layers 62A, 62B may each have a thickness of about 10-30 nm and may be formed of a material having an etch selectivity with respect to oxide and silicon nitride. For example, the first and second sacrificial layers 62A, 62B may be formed of amorphous carbon.

The sacrificial gate layer 64 may have a thickness of about 8-50 nm and may be formed of a material, such as silicon nitride, that has an etch selectivity with respect to oxide.

Figure 3B:
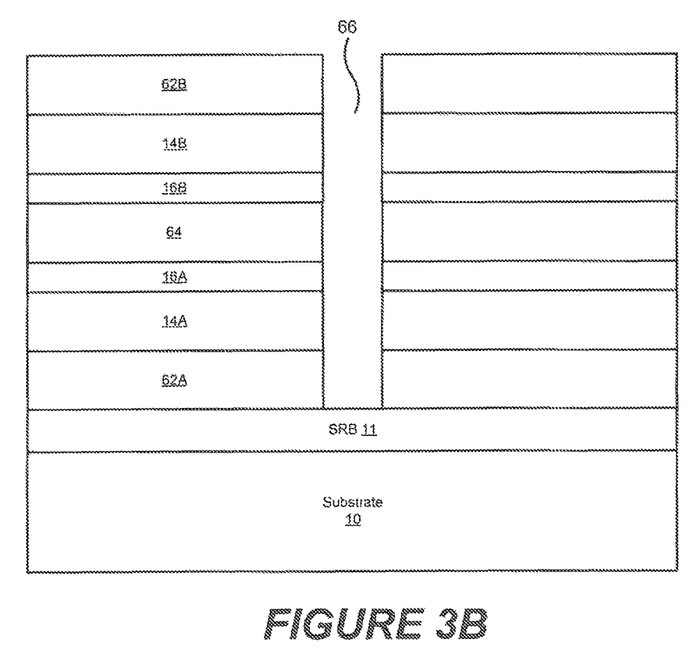

Referring to FIGS. 2 and 3B, a trench 66 is formed in the layer stack, for example, using an anisotropic etch process, such as reactive ion etching or inductively coupled plasma etching (block 208). The trench 66 may extend through the layer stack to the strain relief buffer 11. The trench 66 provides a space in which a fin or pillar can subsequently be formed, as described below.

Figure 3C:
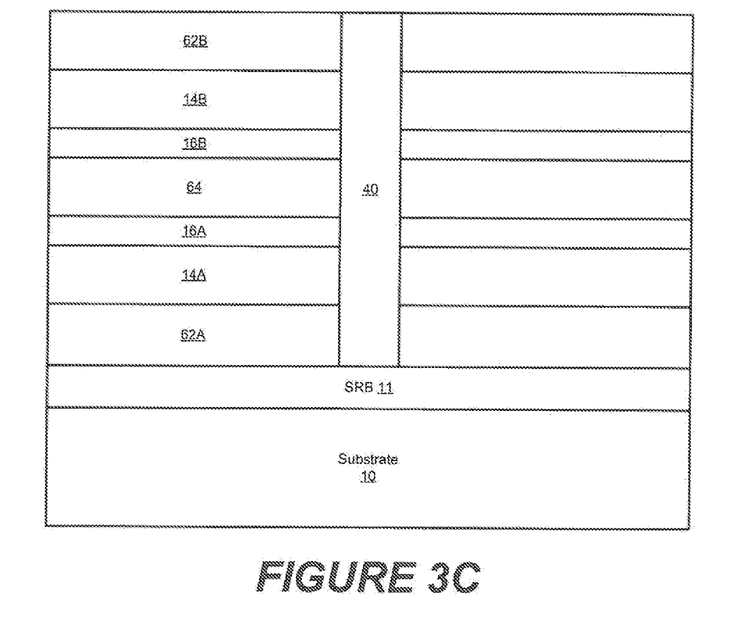

Referring to FIGS. 2 and 3C, a pillar 40 of InGaAs is grown in the trench 66 via epitaxial regrowth using the strain relief buffer 11 as a growth template (block 210). The InGaAs pillar 40 may be relatively Ga-rich. That is, the InGaAs pillar 40 may have an atomic fraction of In that is less than 0.3, and in some embodiments less than 0.25. In some embodiments, the InGaAs pillar 40 may have an atomic fraction of In that is between 0.1 and 0.3, and in some cases between 0.15 and 0.25. In particular embodiments, the InGaAs pillar 40 may comprise $In_{0.25}Ga_{0.75}As$. By providing a Ga-rich pillar, the channel of the final device may have a bandgap that is larger than in a conventional $In_{0.53}Ga_{0.47}As$ based device.

The InGaAs pillar 40 may be doped during growth with n-type dopants near the top and bottom of the pillar 40, and may be doped with p-type dopants near the middle of the pillar 40.

Figure 3D:
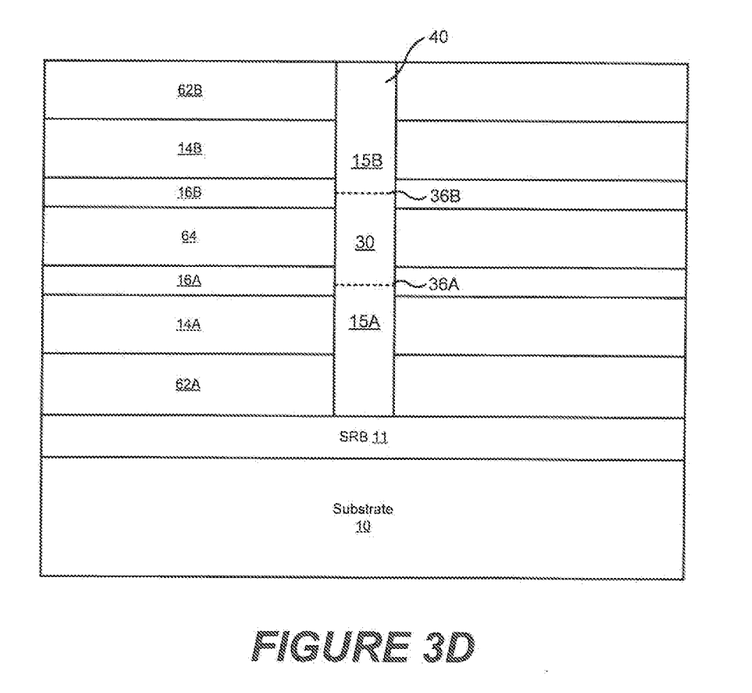

Referring to FIGS. 2 and 3D, in block 212, n-type dopants from the doped spacer layers 14A, 14B, may be diffused into the pillar 40 using a drive-in anneal. The drive-in anneal may be performed for 60 seconds at a temperature of 670° C. Doping the pillar 40 in this manner defines a channel region 30 adjacent the sacrificial gate 64, and source/drain regions 15A, 15B in the pillar above and below the channel region 30 that define respective p-n junctions 36A, 36B with the channel region 30.

Figure 3E:
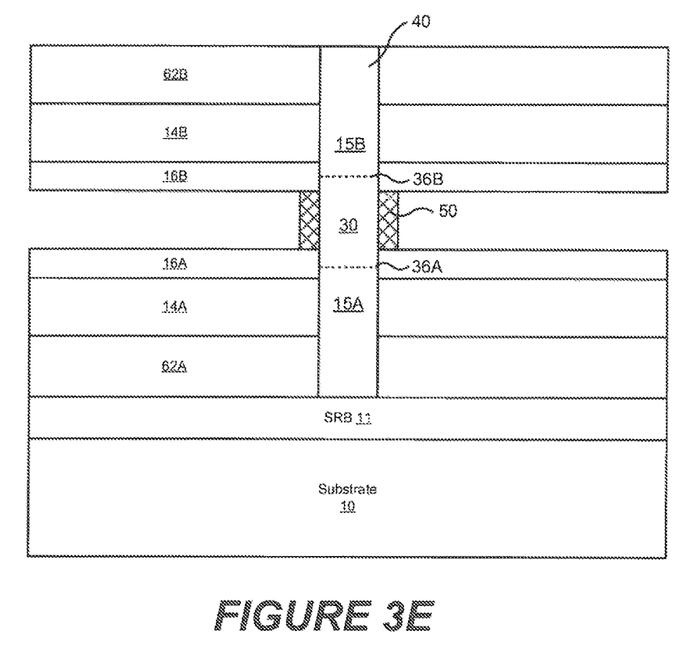

Referring to FIGS. 2 and 3E, the sacrificial gate 64 may be removed, for example, using an isotropic etch, to expose sidewalls of the pillar 40 (block 214). A crystalline stressor layer 50 is then grown via an epitaxial growth technique, such as chemical vapor deposition, on the exposed sidewalls of the pillar 40 (block 216). In some embodiments, the stressor layer 50 may wrap around the pillar 40 to cover all exposed sidewalls of the pillar 40 and in effect form a sheath around the pillar 40 as illustrated, for example, in FIG. 1B.

The stressor layer 50 comprise a material that has a larger lattice constant than a corresponding lattice constant of the material of the pillar 40, so that a biaxial strain is imparted to the pillar 40 adjacent to the channel region 30. As noted above, the material of the stressor layer 50 may be selected from a number of different choices, including a group III-V semiconductor such as AlSb or a group II-VI semiconductor, such as ZnTe, CdS, or CdSe.

The lattice constant of the stressor layer 50 may be about 1% to about 3% larger than a corresponding lattice constant of the vertical channel region 30. This difference in lattice constant causes the stressor layer 50 to impart a biaxial strain of about 0.5 to about 1.5 GPa to the vertical channel region 30, which may cause the mobility of carriers in the channel region 30 to increase and the L-Gamma separation to increase.

Figure 3F:
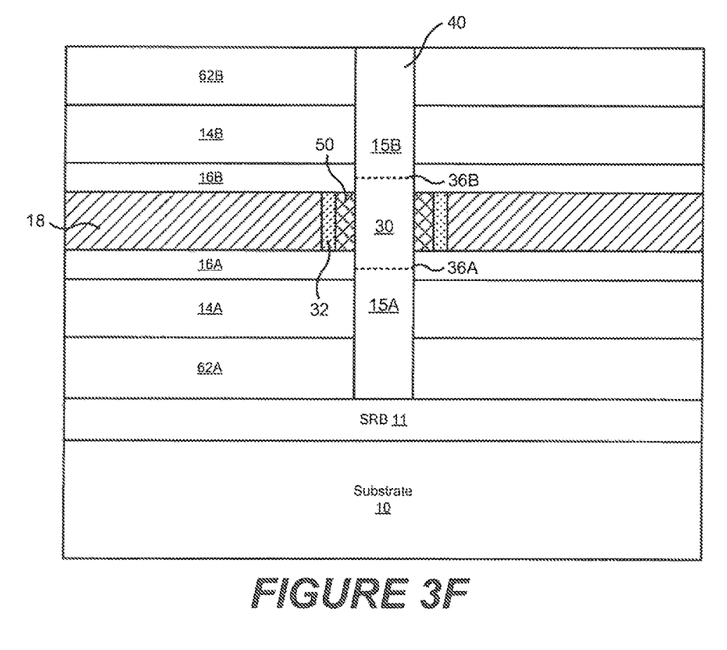

Referring to FIGS. 2 and 3F, a high-K dielectric material, such as HfO is deposited on the stressor layer 50 as a gate insulator 32, and a gate material 18 is formed on the gate insulator 32 in the space formerly occupied by the sacrificial gate layer 64 (block 218). Other dielectric materials for the gate insulator 32 may be used depending on the desired application.

Figure 3G:
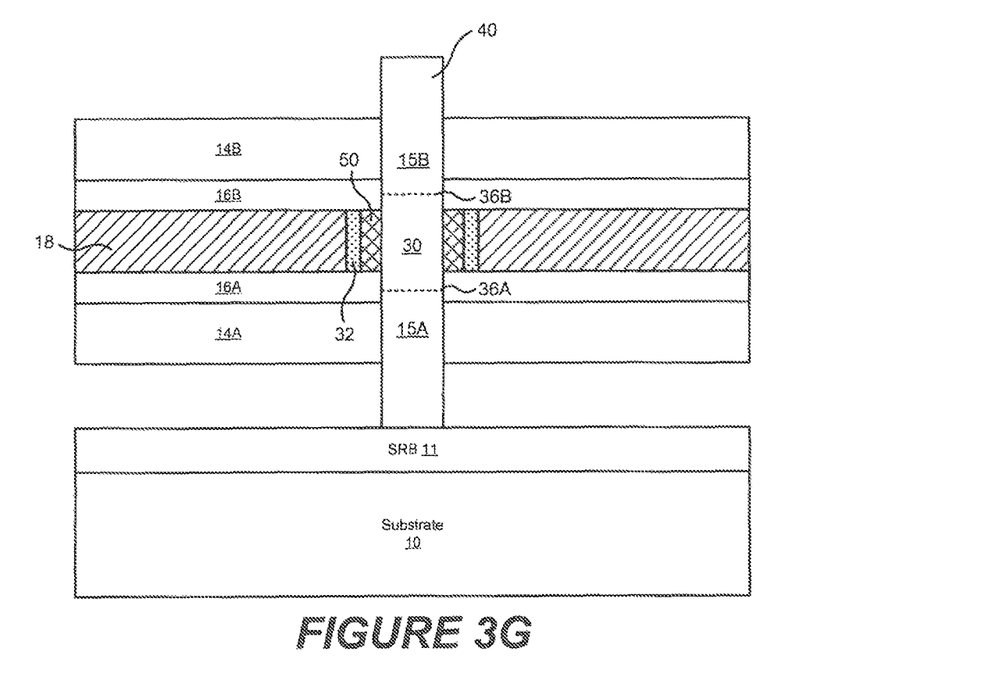

Referring to FIGS. 2 and 3G, the sacrificial source/drain layers 62A, 62B are removed via an isotropic etch process (block 220).

Figure 3H:
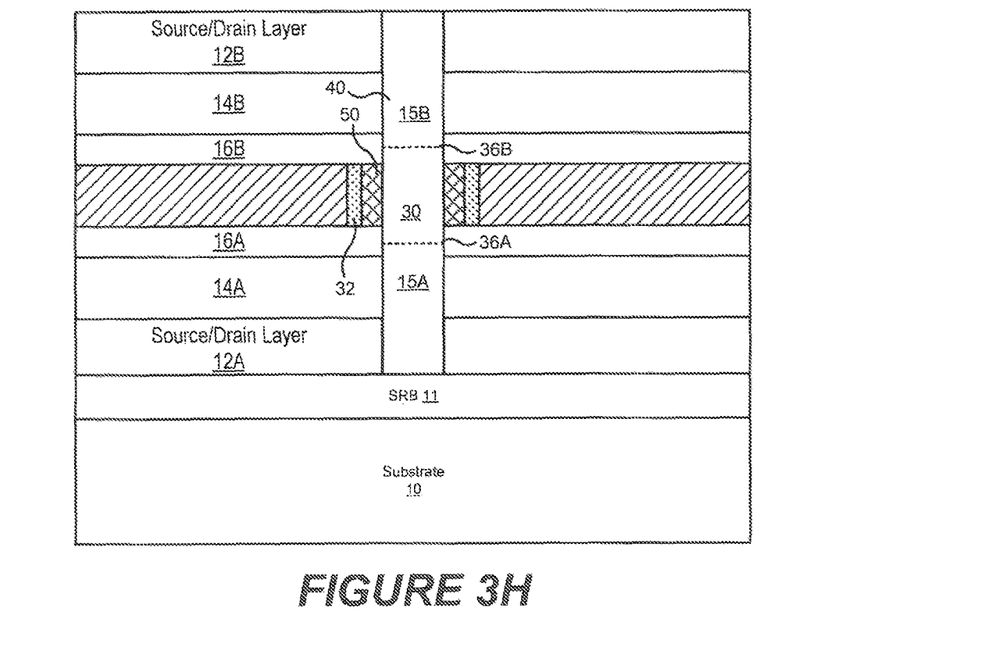

Referring to FIGS. 2 and 3H, source/drain layers 12A, 12B are formed in place of the sacrificial source/drain layers 62A, 62B via epitaxial regrowth of InGaAs (block 222). The source/drain layers 12A, 12B may be doped, for example, with an n-type dopant.

Finally, referring to FIG. 2, source/drain contacts (not shown are formed to the source/drain layers 12A, 12B, completing the device structure.

Accordingly, a device having high channel mobility and capable of operating at large drain voltages may be formed. Moreover, band-to-band tunneling and short channel effects can be reduced.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Some embodiments are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

It is to be understood that the functions/acts noted in flowchart blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A vertical field effect device, comprising:
a substrate;
a vertical channel comprising $In_xGa_{1-x}As$, wherein the vertical channel comprises a pillar that extends vertically from the substrate and includes opposing vertical surfaces;
a stressor layer on the opposing vertical surfaces of the vertical channel, wherein the stressor layer comprises a layer of epitaxial crystalline material that is epitaxially formed on the vertical channel and that has lattice constant in a vertical plane corresponding to one of the opposing vertical surfaces of the vertical channel that is greater than a corresponding lattice constant of the vertical channel;
a dielectric layer on the stressor layer; and
a gate electrode on the dielectric layer,
wherein a vertical thickness of the stressor layer is the same as a vertical thickness of the gate electrode.

2. The vertical field effect device of claim 1, wherein the stressor layer imparts a biaxial tensile strain to the vertical channel in the vertical plane corresponding to the opposing vertical surfaces of the vertical channel.

3. The vertical field effect device of claim 2, wherein the stressor layer comprises a III-V compound semiconductor material.

4. The vertical field effect device of claim 3, wherein the stressor layer comprises InP, AlSb, or GaSb.

5. The vertical field effect device of claim 2, wherein the stressor layer comprises a II-VI compound semiconductor material.

6. The vertical field effect device of claim 5, wherein the stressor layer comprises CdSe or ZnTe.

7. The vertical field effect device of claim 2, wherein the stressor layer imparts a biaxial strain of about 0.5 to about 1.5 GPa to the vertical channel.

8. The vertical field effect device of claim 1,
wherein the opposing vertical surfaces of the vertical channel comprise a first pair of opposing vertical surfaces and the vertical plane comprises a first vertical plane,
wherein the vertical channel comprises a second pair of opposing vertical surfaces that extend in parallel, to a second vertical plane that is perpendicular to the first vertical plane, and
wherein the stressor layer is formed on the second pair of opposing vertical surfaces and has a second lattice constant in the second vertical plane that is greater than a second lattice constant of the vertical channel in the second vertical plane.

9. The vertical field effect device of claim 1, wherein the stressor layer completely envelops the vertical channel.

10. The vertical field effect device of claim 1, wherein $0.1<x<0.3$.

11. The vertical field effect device of claim 7, wherein $0.15<x<0.25$.

12. The vertical field effect device of claim 1, wherein the lattice constant of the stressor layer is about 1% to about 3% larger than the lattice constant of the vertical channel.

13. The vertical field effect device of claim 1, wherein the stressor layer has a thickness of about 0.5 to 2 times a thickness of the vertical channel.

14. The vertical field effect device of claim 1, wherein the stressor layer has a conduction band offset of at least about 200 meV relative to the vertical channel-layer.

15. The vertical field effect device of claim 1, wherein a Gamma-L energy separation in the vertical channel is greater than about 350 meV.

16. The vertical field effect device of claim 1, wherein the vertical channel has a bandgap greater than 1 eV.

17. The vertical Field effect device of claim 1, wherein the vertical channel has a gate length of between 20 inn and 40 nm.

18. The vertical field effect device of claim 1, wherein the vertical channel has a channel width greater than 10 nm.

19. The vertical field effect device of claim 1, wherein the vertical channel has a thickness of between 3 nm and 10 nm.

20. The vertical field effect device of claim 1, wherein the vertical channel has a second vertical surface that is non-parallel to the opposing vertical surfaces, and wherein the stressor layer imparts biaxial strain to both the opposing vertical surfaces of the vertical channel and the second vertical surface of the vertical channel.

21. The vertical field effect device of claim 20, wherein the second vertical surface is perpendicular to the opposing vertical surfaces and extends between the opposing vertical surfaces.

22. A vertical field effect device, comprising;
a substrate;
a vertical channel comprising $In_xGa_{1-x}As$, wherein the vertical channel comprises a pillar that extends vertically from the substrate and includes opposing vertical surfaces;
a first spacer layer and a second spacer layer on the opposing vertical surfaces of the vertical channel, wherein the first and second spacer layers are vertically spaced apart from each other;
a stressor layer on the opposing vertical surfaces of the vertical channel between the first and second spacer layers, wherein the stressor layer comprises a layer of epitaxial crystalline material that is epitaxially formed on the vertical channel and that has lattice, constant in a vertical plane corresponding to one of the opposing vertical surfaces of the vertical channel that is greater than a corresponding lattice constant of the vertical channel;
a dielectric layer on the stressor layer between the first and second spacer layers; and
a gate electrode on the dielectric layer between the first and second spacer layers.

23. The vertical field effect device of claim 22, wherein an upper surface of the stressor layer is coplanar with an upper surface of the gate electrode.

24. The vertical field effect device of claim 22, wherein upper surfaces of the stressor layer, the dielectric layer, and the gate electrode are coplanar with a lower surface of the first spacer layer.

25. The vertical field effect device of claim 22, wherein an upper surface of the stressor layer is closer to the substrate than an upper surface of the vertical channel.

26. A vertical field effect device, comprising:
a substrate;
a pillar that extends vertically from the substrate and includes opposing vertical surfaces, the pillar comprising a vertical channel between first and second source/drain regions, the vertical channel comprising $In_xGa_{1-x}As$;
a first source/drain layer on the opposing vertical surfaces of the pillar adjacent the first source/drain region;
a second source/drain layer on the opposing vertical surfaces of the pillar adjacent the second source/drain region;
a stressor layer on the opposing vertical surfaces of the pillar adjacent the vertical channel, wherein the stressor layer comprises a layer of epitaxial crystalline material that is epitaxially formed on the vertical channel and that has lattice constant in a vertical plane corresponding to one of the opposing vertical surfaces of the vertical channel that is greater than a corresponding lattice constant of the vertical channel;
a dielectric layer on the stressor layer; and
a gate electrode on the dielectric layer.

27. The vertical field effect device of claim 26, wherein the stressor layer is between the first and second source/drain layers.

28. The vertical field effect device of claim 27, wherein the dielectric layer and the gate electrode are between the first and second source/drain layers.

29. The vertical field effect device of claim 26, wherein the first and second source/drain regions comprise $In_yGa_{1-y}As$, where y is not equal to x.

30. The vertical field effect device of claim 29, wherein the first and second source/drain layers comprise $In_yGa_{1-y}As$.

* * * * *